(12) United States Patent
Noma

(10) Patent No.: US 8,053,852 B2
(45) Date of Patent: Nov. 8, 2011

(54) LIGHT SENSOR RECEIVING LIGHT FROM BACKSIDE

(75) Inventor: Takashi Noma, Ota (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 381 days.

(21) Appl. No.: 11/483,185

(22) Filed: Jul. 10, 2006

(65) Prior Publication Data

US 2007/0018263 A1 Jan. 25, 2007

(51) Int. Cl.
*H01L 27/14* (2006.01)

(52) U.S. Cl. ............... 257/428; 257/414; 257/E21.511; 257/E23.126

(58) Field of Classification Search ............. 257/414, 257/428, E21.511, E23.126
See application file for complete search history.

(56) References Cited

U.S. PATENT DOCUMENTS

| | | | |
|---|---|---|---|
| 7,091,599 B2 | 8/2006 | Fujimori | |
| 7,217,590 B2 | 5/2007 | Pourquier et al. | |
| 2004/0032637 A1 | 2/2004 | Imamura | |
| 2004/0077121 A1* | 4/2004 | Maeda et al. | 438/75 |
| 2004/0113215 A1* | 6/2004 | Shimada et al. | 257/414 |
| 2004/0261839 A1 | 12/2004 | Gee et al. | |
| 2005/0074954 A1* | 4/2005 | Yamanaka | 438/458 |
| 2005/0269704 A1* | 12/2005 | Kameyama et al. | 257/751 |
| 2005/0275049 A1* | 12/2005 | Kirby et al. | 257/433 |
| 2006/0151796 A1* | 7/2006 | Kobayashi et al. | 257/85 |

FOREIGN PATENT DOCUMENTS

| | | |
|---|---|---|
| EP | 1536478 | 11/2004 |
| EP | 1 653 520 A1 | 5/2006 |
| EP | 1653520 A1 * | 5/2006 |
| EP | 1 672 695 A1 | 6/2006 |
| JP | 6-77461 | 3/1994 |
| JP | 10-223873 | 8/1998 |
| JP | 2004-207461 | 7/2004 |
| JP | 2005-501421 | 1/2005 |
| KR | 10-2006-0048661 | 5/2006 |
| TW | I230918 | 4/2005 |
| WO | WO-2005/011005 | 2/2005 |
| WO | WO 2005011005 A1 * | 2/2005 |

OTHER PUBLICATIONS

European Search Report dated Dec. 14, 2006, directed to counterpart EP application No. 06014267.6 (6 pages).
Singapore Written Opinion dated Mar. 31, 2009 directed to corresponding Singapore Application No. 200604676-8; (9 pages).
Singapore Search Report dated Mar. 31, 2009 directed to corresponding Singapore Application No. 200604676-8; (8 pages).
Singapore Examination Report mailed Feb. 25, 2010, directed to corresponding Singapore Patent Application No. 200604647-8; 10 pages.

* cited by examiner

*Primary Examiner* — Hung Vu
*Assistant Examiner* — Vernon P Webb
(74) *Attorney, Agent, or Firm* — Morrison & Foerster LLP

(57) ABSTRACT

The invention is directed to enhancement of performance of a back surface incident type semiconductor device having a light receiving element and a manufacturing method thereof without increasing a manufacturing cost. A supporting body is attached to a front surface of a semiconductor substrate formed with a light receiving element and its pad electrode. Then, the supporting body is etched to form a via hole penetrating the supporting body and exposing the pad electrode. Then, a wiring connected to the pad electrode and extending onto a front surface of the supporting body through the via hole is formed. Lastly, the semiconductor substrate is separated into a plurality of semiconductor dies by dicing. The semiconductor device is mounted so that the supporting body faces a circuit board.

7 Claims, 5 Drawing Sheets

LIGHT SENSOR RECEIVING LIGHT FROM BACKSIDE

CROSS-REFERENCE OF THE INVENTION

This invention is based on Japanese Patent Application No. 2005-039902, the content of which is incorporated herein by reference in its entirety.

BACKGROUND OF THE INVENTION

1. Field of the Invention

The invention relates to a semiconductor device and a manufacturing method thereof, particularly, a back surface incident type semiconductor device having a light receiving element and a manufacturing method thereof.

2. Description of the Related Art

A semiconductor device detecting light coming from a main surface of a semiconductor die on the opposite side of a surface formed with a light receiving element has been conventionally known in a semiconductor device having a light receiving element. Such a semiconductor device is called a back surface incident type or back surface irradiation type semiconductor device. Next, a structure of the conventional back surface incident type semiconductor device will be described referring to figures. FIG. 10 is a cross-sectional view of the conventional semiconductor device.

A CCD (Charge Coupled Device) 211 as a light receiving element and its pad electrode 213 are formed on a front surface of a semiconductor die 210 as shown in FIG. 10. An opening 210H is formed on a back surface of the semiconductor die 210. Size of a bottom of the opening 210H is almost the same as that of the region formed with the CCD 211, forming a thin film portion 210T made of a thinned semiconductor die 210. The pad electrode 213 is electrically connected to an external connection electrode 217 formed on a supporting body 215 through a conductive bump 216. A space between the pad electrode 213 and the supporting body 215 is filled with resin 214.

The semiconductor die 210 is set in a package 219. A window member 220 made of glass or the like is provided on the package 219 on the side facing the opening 210H of the semiconductor die 210.

The external connection electrode 217 is connected to the package 219 through a bonding wire 218. In this semiconductor device, light coming from the window member 220 is detected by the CCD 211 through the thin film portion 210T of the semiconductor die 210.

In such a semiconductor device, since an electrode for reading a signal or a power supply wiring that is electrically connected to the CCD 211 does not exist on a light incident side (i.e. on the backside of the semiconductor die 210), light receiving efficiency can be enhanced compared with a design where light coming from the front surface of the semiconductor die 210 on which the CCD 211 is formed is detected. Furthermore, an energy beam such as an ultraviolet ray, a soft X-ray, or an electron beam, that is difficult to be detected when it passes through a thick semiconductor die, can be sensitively detected as much as possible. The relevant technology is disclosed in the Japanese Patent Application Publication No. hei 10-223873.

In a process of manufacturing the described conventional semiconductor device, a region of the semiconductor substrate corresponding to a region formed with the CCD 211 need be thinned, to a thickness of, for example, 10 to 20 μm by grinding. However, since it is very difficult to perform the grinding uniformly, the uniformity of the back surface of the thin film portion 210T thinned by the grinding is reduced. Therefore, light entering the thin film portion 210T is distorted to cause variation in imaging when the CCD receives light, that is, the CCD images. That is, a full performance of the semiconductor device is not guaranteed. Furthermore, since it costs much to partially thin such a semiconductor substrate, a manufacturing cost of the semiconductor device increases.

Furthermore, a mechanical strength of the thin film portion 210T of the semiconductor die 210 is low after the semiconductor device is completed. A connection strength of the bump 216 electrically connecting the semiconductor die 210 and the supporting body 215 is also low. Therefore, electrical connection between elements and electrodes is often insufficient, thereby lowering the performance of the semiconductor device.

SUMMARY OF THE INVENTION

The invention provides a semiconductor device that includes a semiconductor die having a front surface and a back surface, a light receiving element formed on the front surface and configured to receive light coming through the back surface, a pad electrode connected with the light receiving element and disposed on the front surface, a supporting body attached to the front surface and having a via hole standing on the pad electrode, a wiring disposed in the via hole so that the wiring is in contract with the pad electrode at one end of the via hole and extends from another end of the via hole to cover a portion of a surface of the supporting body, and a circuit board having an electrode that is in contact with the wiring covering the portion of the surface of the supporting body.

The invention also provides a method of manufacturing a semiconductor device. The method includes providing a semiconductor substrate having a front surface on which a light receiving element and a pad electrode are formed, attaching a supporting body to the front surface, etching the supporting body to form a via hole so as to expose the pad electrode, forming a wiring in the via hole so that the wiring is in contract with the pad electrode at one end of the via hole and extends from another end of the via hole to cover a portion of a surface of the supporting body, and separating the semiconductor substrate into a plurality of semiconductor dies.

DETAILED DESCRIPTION OF THE INVENTION

A semiconductor device of an embodiment of the invention will be described referring to figures. A method of manufacturing the semiconductor device of the embodiment is described. FIGS. 1 to 8 are cross-sectional views for explaining the method of manufacturing the semiconductor device of the embodiment. FIG. 9 is a cross-sectional view for explaining the semiconductor device and its manufacturing method of the embodiment.

FIGS. 1 to 9 show a successive process steps corresponding to a cross section of a semiconductor substrate at a boundary of adjacent dies to be separated in a dicing step that will be described below (i.e. near a dicing line (not shown)).

Figure 1:
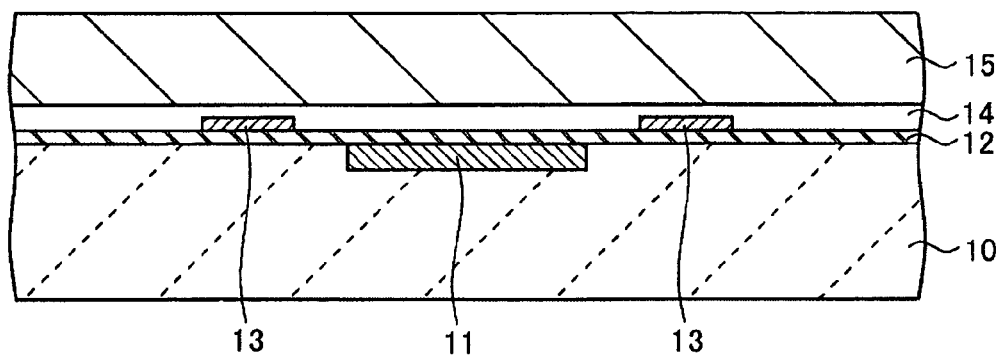
FIGS. 1 to 8 are cross-sectional views for explaining a method of manufacturing a semiconductor device of an embodiment of the invention.

A light receiving element such as, for example, a CCD (Charge Coupled Device) is formed on a front surface of a semiconductor substrate 10 made of a silicon substrate as shown in FIG. 1. It is preferable that this CCD 11 is a so-called frame-transfer type CCD, although other types of CCD may be used. A pad electrode 13 connected to the CCD 11 with an insulation film 12 interposed therebetween is further formed on the front surface of the semiconductor substrate 10. This pad electrode 13 is made of metal, such as aluminum (Al), an aluminum alloy, or copper (Cu), for example. A passivation layer (not shown) made of, for example, a silicon oxide film ($SiO_2$) or a silicon nitride film ($Si_3N_4$) is further formed on the insulation film 12 including on the pad electrode 13 so as to cover the pad electrode 13.

Then, a supporting body 15 in substrate form or tape form is attached to the front surface of this semiconductor substrate 10 with a resin layer 14 made of, for example, epoxy resin interposed therebetween. It is preferable that the supporting body 15 is a glass substrate, for example, although not particularly limited as long as it has a function of supporting and protecting the semiconductor substrate 10. In the case where the supporting body 15 is a glass substrate, the supporting body 15 is formed to have a thickness of, for example, about 100 to 400 μm.

Figure 2:
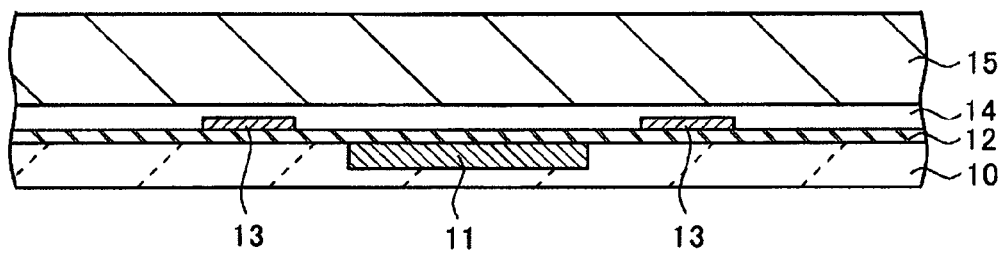

Next, back surface grinding (i.e. a so-called back-grinding) is performed to the semiconductor substrate 10 with this supporting body 15 being attached to the substrate 10 as shown in FIG. 2. In this process, the back surface grinding is performed until the thickness of the semiconductor substrate 10 reaches such a predetermined thickness that light (including an energy beam such as an infrared ray, an ultraviolet ray, a X-ray, or an electron beam except visible light) coming from the back surface of the semiconductor substrate 10 can be detected by the CCD 11. In some case, this grinding process may not be performed depending on the use and specification of an end product or the thickness of a semiconductor substrate prepared at the beginning.

Then, wet etching is performed to the whole back surface of the semiconductor substrate 10 completing the back surface grinding. This etching is performed using a mixture of hydrogen fluoride (HF) and nitric acid ($HNO_3$) as an etchant, for example. This process removes unevenness or a mechanically damaged layer of the back surface of the semiconductor substrate 10 caused by the back surface grinding and enhances uniformity of the back surface. Thus, the surface of the back surface incident type semiconductor device where light enters enjoys less distortion, refraction, reflection, and so on of incident light. Even in the described case where the back surface grinding process is not performed, this wet etching can be performed depending on the state of the back surface of the semiconductor substrate and so on.

The back surface grinding and wet etching of the semiconductor substrate 10 are performed so that the thickness of the semiconductor substrate 10 eventually becomes about 10 to 30 μm, for example.

Figure 3:
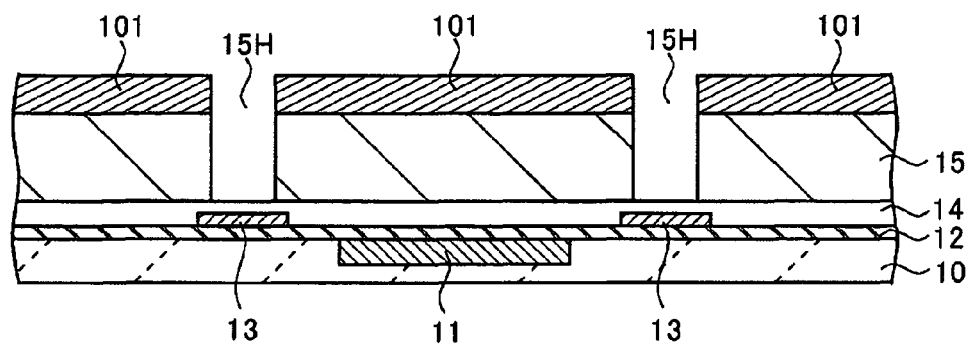

Next, a resist layer 101 is formed on a portion of a front surface of the supporting body 15 as shown in FIG. 3. That is, the resist layer 101 is formed having an opening in a position corresponding to the pad electrode 13. Then, an etching is performed to the supporting body 15 using the resist layer 101 as a mask. It is preferable to perform the etching by dip etching using a hydrogen fluoride (HF) aqueous solution as an etching solution, for example. Alternatively, this etching can be performed by the other wet etching or dry etching. An opening penetrating the supporting body 15 is formed by this etching. The resin layer 14 is exposed at a bottom of the opening, and the pad electrode 13 is positioned thereunder being in contact with the resin layer 14. The opening 15H can be also formed by a so-called sandblasting.

Figure 4:
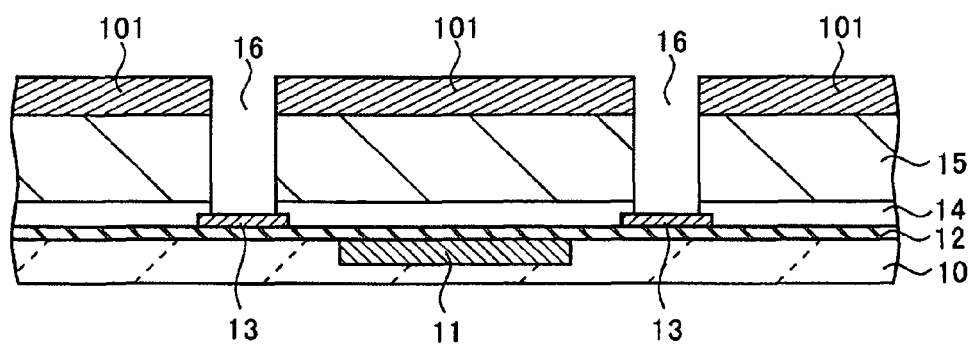

Next, the resin layer 14 exposed at the bottom of the opening 15H and the passivation layer (not shown) positioned there are removed as shown in FIG. 4. A via hole 16 penetrating the supporting body 15, the resin layer 14, and the passivation layer (not shown) is formed by the remove of the resin layer 14 and the passivation layer (not shown). The pad electrode 13 is exposed at a bottom of the via hole 16.

It is preferable to remove the resin layer 14 by dip etching using an organic solvent as an etching solution, for example. The resist layer 101 is used as an etching mask in this etching. The resist layer 101 is removed after the etching. Alternatively, the resin layer 14 can be removed by the other wet etching or dry etching. Alternatively, the resin layer 14 can be removed by so-called ashing. The passivation layer (not shown) is removed by predetermined etching using the resist layer 101 as a mask.

The passivation layer (not shown), the resin layer 14, and the supporting body 15 in the position corresponding to the pad electrode 13 can be removed by performing etching at one process step. In this case, wet etching or dry etching with a predetermined etching solution or etching gas are performed to the passivation layer (not shown), the resin layer 14, and the supporting body 15 using the resist layer 101 as a mask.

Figure 5:
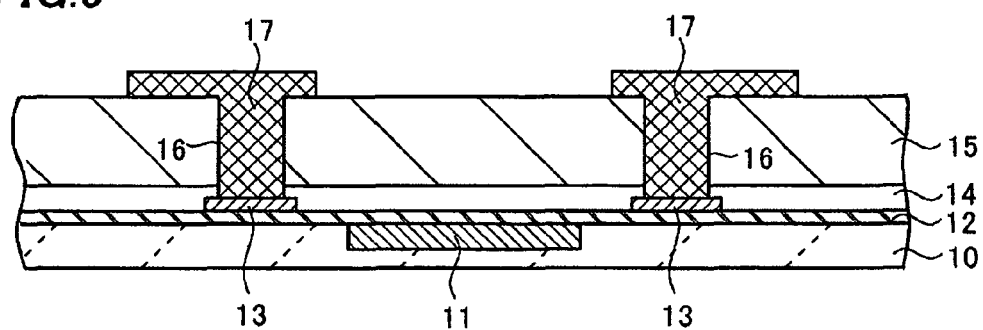

Next, a conductive paste is printed in the via hole 16 and on the front surface of the supporting body 15 along a wiring pattern for connecting with a circuit board 30 as shown in FIG. 5. This conductive paste is connected to the pad electrode 13 and forms a wiring 17 extending onto a portion of the front surface of the supporting body 15 through the via hole 16.

At this time, the printing can be performed plural times in a case where the conductive paste can not be printed so as to be connected to the pad electrode 13 and extending onto the front surface of the supporting body 15 by performing the printing at a time due to the size of the via hole 16. For example, it is possible that conductive paste is printed so as to fill the via hole 16 first, and then conductive paste is printed thereon so as to extend onto the front surface of the supporting body 15.

It is preferable that the conductive paste is silver (Ag), tin (Sn), bismuth (Bi) or a mixture of these. In this case, the wiring 17 made of the conductive paste can obtain higher resistance to corrosion and higher reliability than the wiring made of aluminum (Al). Furthermore, since the wiring 17 made of the conductive paste does not suffer from chemical contamination such as copper (Cu) contamination in the wiring made of copper, a process for preventing the chemical contamination is not needed. Therefore, a manufacturing cost can be minimized.

Next, the semiconductor substrate 10 formed with the wiring 17 is baked to set the wiring 17. In this process, baking the semiconductor substrate 10 formed with the wiring 17 is performed for about 10 minutes at temperature of about 150 degrees, for example. However, the temperature and time necessary for the baking depend on the conductive paste and may vary from those above.

It is possible that the conductive paste forming the above wiring 17 is mixed with a predetermined solvent and coated by spray thereof using a mask. The wiring 17 can be formed by the other method than the printing or spray coating of the conductive paste. For example, the wiring 17 can be formed by a sputtering. Alternatively, a ball-shaped conductive terminal can be formed on the wiring 17 on the front surface of the supporting body 15, for example, although not shown. The wiring 17 can be formed in the vial hole 16 only so as to completely fill the via hole 16 without extending onto the front surface of the supporting body 15.

Figure 6:
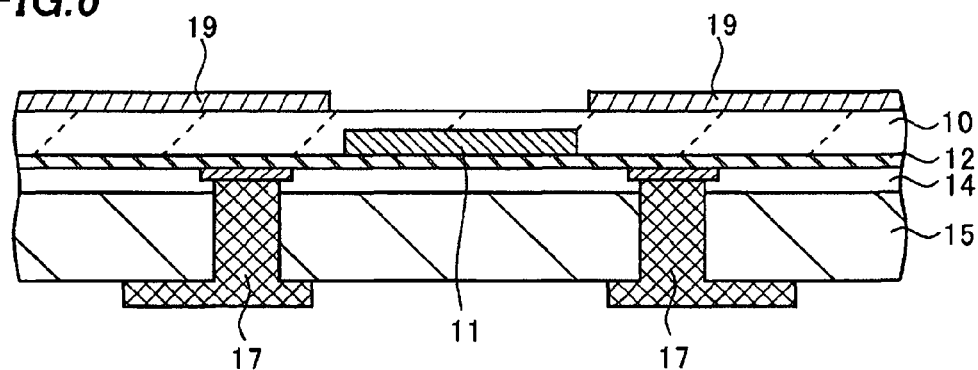

Next, the semiconductor substrate 10 is turned upside down, and then a light shield film 19 is formed on a portion of the back surface of the semiconductor substrate 10 so as to cover a region except a light receiving region of the CCD 11 or a region except the region formed with the CCD 11, as shown in FIG. 6. A material and a formation method of the light shield film 19 are not particularly limited as long as the film 19 can shield light of a wavelength band the CCD 11 detects. For example, the light shield film 19 is formed by screen printing or coating a black resist material. The light shield film 19 is formed according to needs, and is omitted in a case where it is not necessary to shield light incident on the CCD 11.

Figure 7:
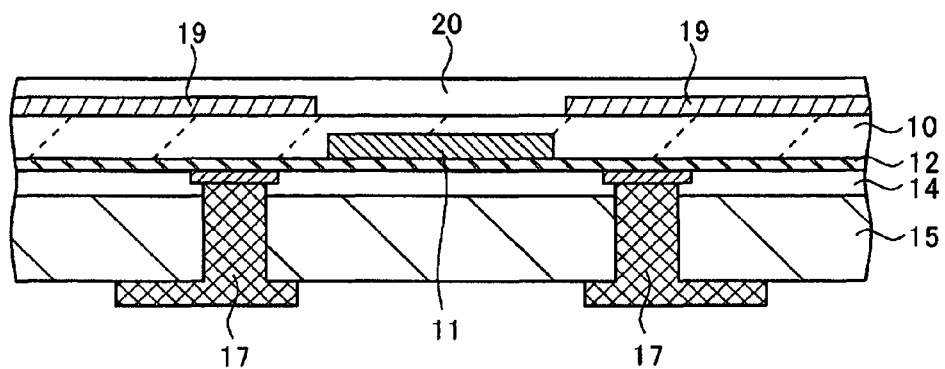

Furthermore, a color filter 20 transmitting light of a predetermined wavelength band is formed on the back surface of the semiconductor substrate 10 at least including the light receiving region of the CCD 11 according to needs as shown in FIG. 7. The color filter 20 is formed on the whole back surface of the semiconductor substrate 10 in FIG. 7. This color filter 20 is made of, for example, an acrylic resist material although not particularly limited.

It is possible to form a surface protection layer made of a predetermined material so as to cover the light shield film 19 and the color filter 20 according to needs although not shown. Alternatively, a glass cover can be attached thereto.

Figure 8:
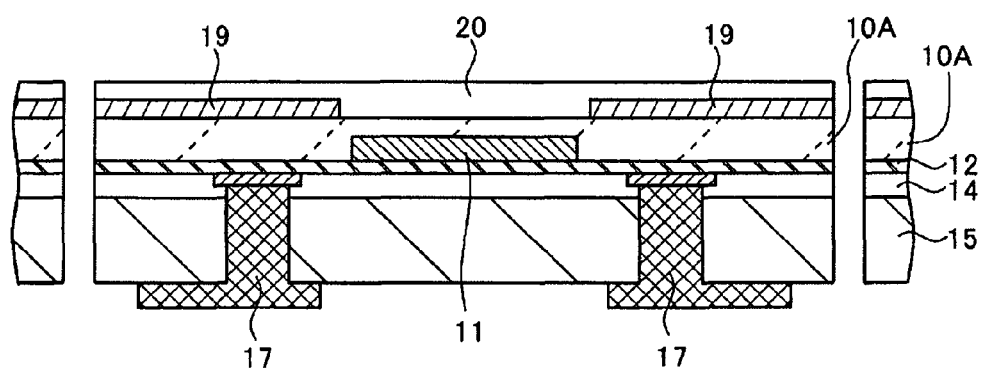
Figure 9:
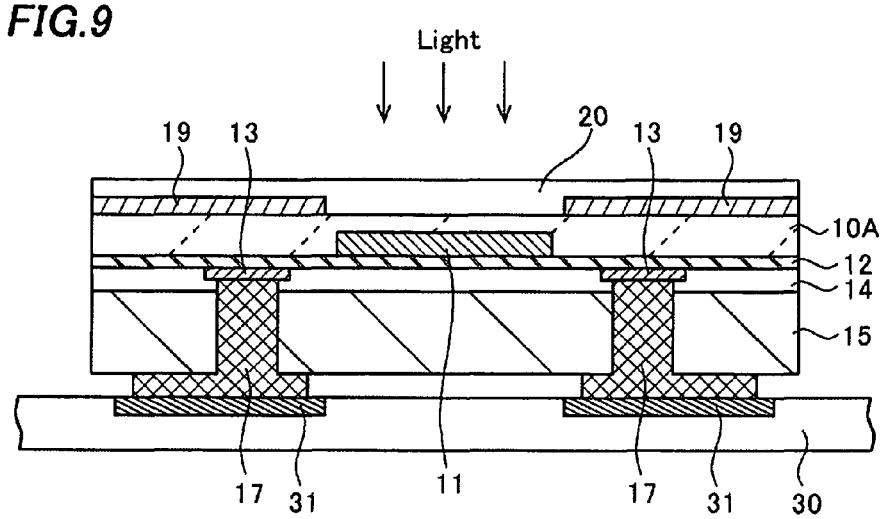
FIG. 9 is a cross-sectional view for explaining a semiconductor device and its manufacturing method of the embodiment of the invention.
Figure 10:
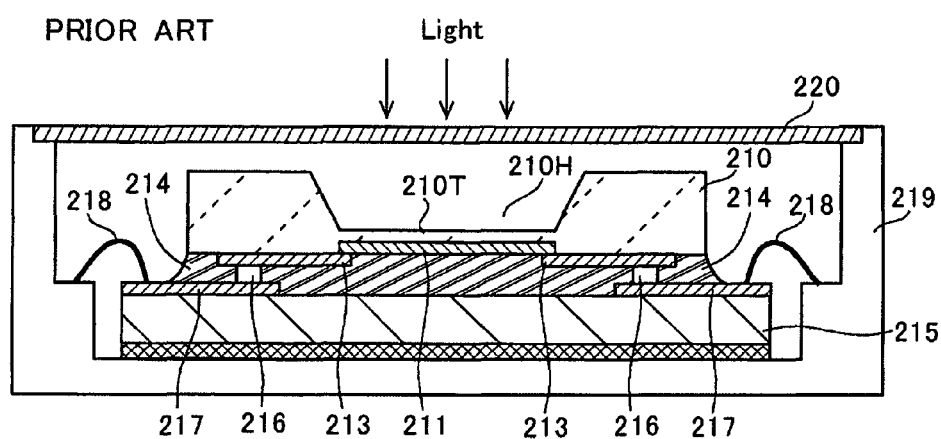
FIG. 10 is a cross-sectional view for explaining a semiconductor device of a conventional art.

Lastly, the semiconductor substrate 10 is separated into a plurality of semiconductor dies 10A by dicing along a dicing line (not shown) as shown in FIG. 8. The semiconductor device of the embodiment is thus completed. The completed semiconductor device is mounted on the circuit board 30 where the external electrode 31 is patterned as shown in FIG. 9. At this time, the external electrode 31 of the circuit board 30 and the wiring 17 extending onto the supporting body 15 are electrically connected and face each other.

Accordingly, in the semiconductor device of the described embodiment, the uniformity of the back surface that is a light incident surface is enhanced by the back surface grinding and wet etching of the semiconductor substrate 10 shown in FIG. 2, compared with the conventional art. That is, since the surface of the back surface incident type semiconductor device where light enters possesses preferable characteristics, i.e., reduced distortion, refraction, and reflection of incident light, light receiving or imaging can be precisely performed as much as possible. Furthermore, since the whole surface of the semiconductor die 10A is supported by the supporting body 15, the mechanical strength of the semiconductor device can be enhanced compared with the conventional art.

Furthermore, this semiconductor device does not need a process of forming a thin film portion 210T by partially opening a semiconductor substrate 210, a process of forming a bump 216 and an external connection electrode 217 for connecting a semiconductor die 210 and a package 219, or a process of forming a bonding wire 218 as have been needed in the conventional back surface incident type semiconductor device. Therefore, the manufacturing cost and the mounting cost of the semiconductor device can be minimized.

As a result, the performance can be enhanced in the back surface incident type semiconductor device having the light receiving element and its manufacturing method without increasing the manufacturing cost.

Although the CCD is formed as the light receiving element in the semiconductor substrate 10 in the described embodiment, the invention is not limited to this and can be applied to the device where the other light receiving element (e.g. a photodiode, an infrared ray sensor, or the like) than the CCD is formed.

What is claimed is:

1. A semiconductor device comprising:
   a semiconductor die having a front surface and a back surface and comprising a semiconductor portion between the front and the back surfaces, the semiconductor portion constituting the entire semiconductor portion between the front surface and the back surface of the semiconductor die;
   a light receiving element formed on the front surface as part of the semiconductor die and configured to receive light coming through the semiconductor portion in which the light receiving element is not formed;
   a pad electrode connected with the light receiving element and disposed on the front surface;
   a supporting body attached to the front surface and having a via hole standing on the pad electrode;
   a wiring disposed in the via hole so that the wiring is in contact with the pad electrode at one end of the via hole and extends from another end of the via hole to cover a portion of a surface of the supporting body; and
   a circuit board comprising an electrode that is in contact with the wiring covering the portion of the surface of the supporting body,
   wherein an average thickness of the semiconductor portion at the light receiving element and a thickness of the semiconductor portion at the via hole of the supporting body are substantially the same.

2. The semiconductor device of claim 1, wherein the light receiving element comprises a CCD, a photodiode or an infrared sensor.

3. The semiconductor device of claim 1, wherein the wiring comprises a conductive paste.

4. The semiconductor device of claim 1, further comprising a light shield film disposed on the back surface so as not to cover the light receiving element.

5. The semiconductor device of claim 1, further comprising a color filter disposed on the back surface and transmitting light of a predetermined wavelength band.

6. The semiconductor device of claim 1, further comprising an adhesive layer attaching the supporting body to the front surface of the semiconductor die.

7. The semiconductor device of claim 4, wherein the light shield film overlaps the pad electrode.

* * * * *